United States Patent
Boeckmann et al.

[11] Patent Number: 5,852,372
[45] Date of Patent: Dec. 22, 1998

[54] APPARATUS AND METHOD FOR SIGNAL HANDLING ON GTL-TYPE BUSES

[75] Inventors: Eduard F. Boeckmann, Huntsville; Vern Brethour, Owens Cross Road, both of Ala.; Vahid Samiee, Austin, Tex.

[73] Assignee: Intergraph Corporation, Huntsville, Ala.

[21] Appl. No.: 803,157

[22] Filed: Feb. 19, 1997

Related U.S. Application Data

[60] Provisional application No. 60/011,932 Feb. 20, 1996.

[51] Int. Cl.$^6$ ................................ H03K 19/175
[52] U.S. Cl. ................... 326/83; 326/81; 326/27; 326/30
[58] Field of Search ................ 326/17, 30, 27, 326/83, 86

[56] References Cited

U.S. PATENT DOCUMENTS

| | | | |
|---|---|---|---|
| 5,117,131 | 5/1992 | Ochi et al. | 326/27 |
| 5,233,237 | 8/1993 | Ohannes et al. | 307/443 |
| 5,412,259 | 5/1995 | Tokumaru et al. | 326/83 |
| 5,539,341 | 7/1996 | Kuo | 326/30 |

FOREIGN PATENT DOCUMENTS

| | | |
|---|---|---|
| 0 380 960 A2 | 8/1990 | European Pat. Off. . |
| 0 459 457 A2 | 12/1991 | European Pat. Off. . |
| 62-13120 (A) | 1/1987 | Japan ........ 326/87 |

*Primary Examiner*—Edward P. Westin
*Assistant Examiner*—Don Phu Le
*Attorney, Agent, or Firm*—Bromberg & Sunstein LLP

[57] ABSTRACT

Transceivers for bus communications using GTL-type transmission-line bus structures provide improved clamping of an initially ON output pulse of a communication bus driver and adds an active pull-up function inside the integrated circuit that does not change the external circuit nor require additional functional external circuit corrections. Receivers may contain an active pull-up for added signal quality improvement Improved clamping and active pull-up allow reduced width of the channel of the N-channel CMOS output transistor. A drive/receive clamp may be added to a sequential pull-up circuit and an active pull-up circuit for better performance at higher frequencies. A related method may comprise first switching OFF an active pull down circuit and switching ON an active pull-up circuit, where the active pull-up circuit clamps the driver output voltage from falling below a first voltage. Then switching OFF a first clamping circuit, where the first clamping circuit clamps the driver output voltage from exceeding a second voltage when the first damping circuit is ON, and where the second voltage is greater than the first voltage. And then switching OFF a second clamping circuit, where the second clamping circuit clamps the driver output voltage from exceeding a third voltage when the second clamping circuit is ON, and where the third voltage is greater than the second voltage.

27 Claims, 3 Drawing Sheets

APPARATUS AND METHOD FOR SIGNAL HANDLING ON GTL-TYPE BUSES

RELATED APPLICATION

This application claims priority for subject matter disclosed in a previously filed provisional application entitled METHOD AND APPARATUS FOR SIGNAL HANDLING ON GTL-TYPE BUSES, having Ser. No. 60/011,932, filed Feb. 20, 1996. This related application is hereby incorporated herein by reference.

FIELD OF THE INVENTION

This invention relates to transceivers for binary bus communications using GTL (Gunning transceiver logic) type transmission line bus structures.

BACKGROUND ART

Although there can be many different communication buses used within a computer, one design is that of the GTL-type bus. Examples of GTL-type transmission buses are in U.S. Pat. No. 5,023,488, granted to inventor Gunning, which patent is incorporated herein by reference. Although use of a GTL-type bus has become standard practice in computer architecture design, as computer hardware has become increasingly faster, this architecture is insufficient to prevent some signal communication problems. As digital computers utilize higher clocking frequencies and more complex structures, with some systems containing multiple processors, it becomes an extremely complex problem to maintain signal integrity. For example, at high speeds, printed circuit board traces start to behave like transmission lines and become capable of producing reflected electrical signal waves. These waves are most pronounced at circuit board discontinuities, such as at a device load, transmission-line junction points with other traces, or at trace ends that may not be ideally terminated in the characteristic impedance of the transmission line. A transmission line, if not ideally terminated with its exact characteristic impedance, may cause a reflected electrical wave at its termination. This wave will travel along the trace to the other end of the transmission line, and if that end is not ideally terminated, the signal may reflect again at the opposite end. These reflections will continue to multiply and propagate back and forth along the line.

Transmission lines of printed circuit boards are used to interconnect components such as drivers, receivers, transceivers, multiplexors, flip-flops, clocks, counters, resistors, capacitors, complementary metal oxide semiconductor (CMOS) circuits, and very large scale integrated (VLSI) circuits. Each component connected to a transmission line necessarily breaks the transmission line into a multisegmented transmission line. The printed circuit board traces generally fall into two categories: (1) strip line traces, which are traces on the outside surfaces of the printed circuit board, and (2) micro strip traces, which are traces buried within a dielectric layer between two ground or conducting planes. Both types of traces may act as if they were high-frequency transmission lines, and if they are not properly terminated, they may cause severe signal distortion due to reflections. Unfortunately, in practice it is not always possible or practical to terminate every transmission line or printed circuit board trace with its ideal impedance. And, although a short trace length may not need termination, since the reflection problem is essentially a function of the line's electrical length, there may be significant signal reflections occurring in high-frequency circuits having significant trace lengths.

In addition to reflections impacting signal integrity, another well-known source of signal integrity concern is from parasitic inductance, capacitance, and resistance effects caused by the internal connections, traces, and dielectric materials used in manufacturing integrated circuit packages. As with transmission lines, if these component effects are not compensated for in some way, very severe signal quality and intensity degradation may occur.

There are well known prior art methods for ensuring signal quality by terminating signal lines to reduce signal reflection problems. The GTL bus is typical of such solutions. This bus is generally terminated at both ends with a "pull-up" resistor to the VDD voltage which is usually 1.2 to 1.5 volts. Alternate methods for terminating the bus include series and parallel resistor terminations at the driver source node, and parallel resistor terminations at the receiver nodes. A further technique involves use of a resistor divider, whereby one resistor is connected to a positive voltage and the other resistor is connected to a negative or common point, so that the bus and termination are biased. In this last example, the effective value of the termination is the impedance of the two resistors in parallel.

The GTL bus is designed to interface only transceivers or drivers and receivers between various CMOS or VLSI integrated circuits. This bus is usually terminated at both ends using 70 to 100 ohm resistors so that the effective driver load may be as low as 35 ohms (not counting the device loads that may also be present).

More recent circuit developments have resulted in utilization of voltages such as 3.3V, or lower, instead of earlier 5 volt logic device designs. In addition, designs have begun using 1.2 to 1.5 volts for bus pull-up voltage. This allows a considerable power dissipation savings over 5 volt logic, but requires that noise be very low, and signal quality be very high, in order to ensure that proper timing will result for set-up and hold times relative to clocking pulses.

Prior art attempts to improve signal distortion on buses have focused on various digital binary circuit design communication systems. Some of these solutions are known as emitter coupled logic (ECL), positive emitter coupled logic (PECL), transistor-transistor logic (TTL), backplane transistor logic (BTL), and Gunning transceiver logic (GTL) using various voltage levels and threshold levels. For use on transmission line bus structures, the voltage levels are usually 0 to 3.5 V for TTL, 3.2 to 4.2 V for PECL, 1.1 to 2.0 V for BTL, and 1.2 to 1.5 V for GTL.

In the GTL bus method of binary communication, it is customary to use an open drain output transistor in the driver so that bus current is only sunk to the integrated circuit driver and not sourced by it. Various methods of clamping the output transistor to reduce circuit ring have been used. Prior methods have utilized feedback or clamping-to-common to reduce overshoot of high pulses on the bus; with this method, the output of the driver is pulled high only by the external pull-up resistor usually located at the ends of the bus.

In the GTL bus method, the connection of the devices along the length of the transmission line may cause capacitive loading of the line. This in turn may affect the effective characteristic impedance of the line and cause reflections at connection nodes. Reflections may add to the ringing caused by IC package parasitics, resulting in unacceptable signal quality, especially if pulse rise times are fast, such as in the 1 to 5 volts per nanosecond range.

There are severe limitations imposed on the bus termination values, as the resistors cannot have too low a resistance value so as to sink too much current into the IC, and also mismatch the characteristic impedance of the transmission line. Therefore, if more "pull-up" is required to combat ring-down of high signals, there is no remedy in the GTL bus structure for this and there have been no driver circuits available to provide the needed compensation.

SUMMARY

In a preferred embodiment, the invention suppresses distortion and ringing of a signal. The invention provides a new type of driver circuit with improved clamping and active pull-up. The improved driver helps compensate for IC package parasitics and bus transmission line reflection effects.

A preferred embodiment includes a driver for providing bus signals at a driver output in response to an input signal, the driver having a driver input responsive to the input signal, a supply voltage terminal, and a ground terminal. The driver has a first switching element having a switching state responsive to the input signal to provide a low impedance between the driver output and the ground terminal when the first switching element is ON and to provide a high impedance between the driver output and the ground terminal when the first switching element is OFF.

The driver also includes a second switching element having a switching state responsive to the input signal to provide a high impedance between the driver output and the supply voltage terminal when the second switching element is OFF. The first and second switching elements are switched in a complementary fashion, so that when the first switching element is switched from ON to OFF, the second switching element is switched from OFF to ON, and when the first switching element is switched from OFF to ON, the second switching element is switched from ON to OFF.

The driver also includes a first clamping device between the driver output and the supply voltage terminal, so as to provide a non-linear resistance diode-action when the second switching element is ON. The driver also includes a first delay element having an input responsive to the input signal, and an output with a voltage. The driver also includes a third switching element having a switching state responsive to the output voltage of the first delay element, so as to provide a high impedance between the driver output and the ground terminal when the third switching element is OFF. The driver also includes a second clamping device between the driver output and the ground terminal, so as to provide a non-linear resistance diode-action when the third switching element is ON.

The driver also includes a second delay element having an input responsive to the output voltage of the first delay element, and an output with a voltage. The driver also includes a fourth switching element having a switching state responsive to the output voltage of the second delay element to provide a high impedance between the driver output and the ground terminal when the fourth switching element is OFF. The driver also includes a third clamping device between the driver output and the ground terminal, so as to provide a non-linear resistance diode-action when the fourth switching element is ON.

In a further embodiment, the first clamping device includes first and second diode-connected MOSFETs connected in series, the second clamping device includes a third diode-connected MOSFET, and the third clamping device includes a fourth diode-connected MOSFET. In a still further embodiment, the first and second switching elements together include a CMOS switch, the third switching element includes a first MOSFET switch, and the fourth switching element includes a second MOSFET switch.

In a preferred embodiment, the first clamping device clamps the driver output's voltage so as not to fall below a first voltage when the second switching element is ON, the second clamping device clamps the driver output's voltage so as not to rise above a second voltage when the third switching element in ON, and the third clamping device clamps the driver output's voltage so as not to rise above a third voltage when the fourth switching element is ON. Thus, the first voltage is less than the second and third voltages, and the third voltage is greater than the second voltage.

A preferred embodiment of the invention may also include a drive-receive clamp, the drive-receive clamp having a fifth switching element to provide a high impedance between the driver output and the ground terminal when the fifth switching element is OFF; a fourth clamping device between the driver output and the ground terminal, so as to provide a non-linear resistance diode-action when the fifth switching element is ON; and a fifth clamping device to switch the fifth switching element ON and OFF, the fifth clamping element responsive to the driver output voltage so that the fifth switching element is switched ON when the driver output's voltage exceeds a high voltage level.

In a further embodiment, the drive-receive clamp also includes a third MOSFET to provide a high impedance between the driver output and the ground terminal when the MOSFET is OFF; a fifth diode-connected MOSFET between the driver output and the ground terminal, so as to provide a non-linear resistance diode-action when the third MOSFET is ON; and a sixth diode-connected MOSFET to switch the third MOSFET ON and OFF, the sixth diode-connected MOSFET responsive to the driver output voltage so that the third MOSFET is switched ON when the driver output's voltage exceeds a high voltage level.

In a further embodiment, the drive-receive clamp also includes a fifth switching element to provide a high impedance between the driver output and the ground terminal when the fifth switching element is OFF, a fourth clamping device to clamp the driver output's voltage so as not to rise above a first high voltage when the fifth switching element is ON, and a fifth clamping device to switch the fifth switching element ON when driver output's voltage rises above a second high voltage.

A preferred embodiment also includes a method for switching a driver output voltage to provide bus signals on a bus, such a preferred method including the steps of first switching OFF an active pull down circuit and switching ON an active pull up circuit, where the active pull up circuit clamps the driver output voltage from falling below a first voltage. Then switching OFF a first clamping circuit, where the first clamping circuit clamps the driver output voltage from exceeding a second voltage when the first clamping circuit is ON, and where the second voltage is greater than the first voltage. And then switching OFF a second clamping circuit, where the first clamping circuit clamps the driver output voltage from exceeding a third voltage when the second clamping circuit is ON, and where the third voltage is greater than the second voltage.

A preferred method embodiment may also include the steps of first switching ON the active pull down circuit and switching OFF the active pull up circuit, then switching ON the first clamping circuit. And then switching ON the second clamping circuit.

A preferred embodiment may include using a pull down circuit having a first MOSFET, a pull up circuit having a second MOSFET, a first diode-connected MOSFET, and a second diode-connected MOSFET, where the first and second MOSFETs are configured as a CMOS switching element, where the CMOS switching element and the first and second diode-connected MOSFETs are connected in series, and the second diode-connected MOSFET is connected to a voltage supply source.

Preferably, the first clamping device includes a third MOSFET, and a third diode-connected MOSFET, where the third MOSFET is connected in series to the third diode-connected MOSFET. Preferably, the second clamping device includes a fourth MOSFET, a fourth diode-connected MOSFET, and a fifth diode-connected MOSFET, where the fourth MOSFET and fourth and fifth diode-connected MOSFETs are connected in series.

A preferred embodiment may also include the supplementing or replacing the standard resistors at the ends of a GTL-type bus with resistive terminations, designed in accordance with a preferred embodiment of the driver and receive-clamp circuits, at the driver and receiver nodes on the bus.

DETAILED DESCRIPTION OF SPECIFIC EMBODIMENTS

Figure 1A:
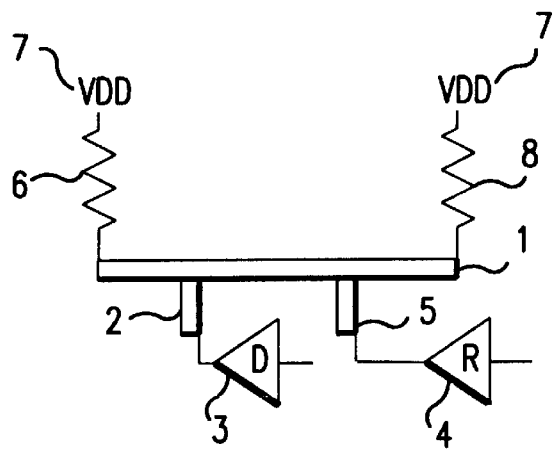
FIG. 1A is a diagram of a GTL-type bus.

This invention provides, in a preferred embodiment, an improved clamping of an initially ON (i.e. high going) output pulse of the communication bus driver and adds an active pull-up function inside the integrated circuit that does not change the external circuit nor require additional functional external circuit connections. In addition, in a preferred embodiment, the receivers may also contain the active pull-up for added signal quality improvement. With the improved clamping and active pull-up, the width of the channel of the N-channel CMOS output transistor can be reduced over what would be required without the invention. A small additional current drain of approximately 1 to 4 milliamperes of current is typically required for the active pull up, depending on the external loads and degree of pull-up required by the external circuit. As an additional aid to damping the ringing and reflections on the driver output and the receiver inputs, the drive/receive clamp can be added to the sequential pull-up circuit and the active pull-up circuit in combination of all three improvements for superior performance at higher frequencies.

The improved clamping involves a time sequential clamping function whereby first a hard clamp is applied for approximately one nanosecond, typically clamping to a level of approximately 80% of the bus pull-up voltage, and then a second softer clamping to approximately 90 to 95% of the bus pull-up voltage for several nanoseconds or to the end of the high pulse. This clamping action allows the pulse rise time to be relatively fast because the clamping action will round off the corner of the pulse resulting in a lower ring effect in the external circuit.

If the signal then starts to ring below approximately 1 volt, the active pull-up circuit in accordance with one embodiment of the invention will then inject current from the 3.3 volt VDD source to pull the output signal back up. The active pull-up is automatically turned OFF when the driver is ON (low state). The overall improvements then result in a driver action whereby the high excursion of the pulse is controlled from either too much over-shoot or too much ringing back down ("ring-down"). Also, the improvements allow faster pulse rise times and fall times which provides for operation at higher frequencies and alleviates the need for "controlled rise and fall times" as would otherwise be required.

Finally, the drive/receive clamp provides a continuous clamping action whether in drive or receive mode. The clamping threshold is set by the combined threshold of a diode-connected MOSFET and the turn-on threshold of a similar but larger n-channel transistor with a third transistor, diode-connected to limit current. The clamping threshold and clamping current is set by the relative sizes of the transistors. The clamping threshold is normally set at approximately 1.5 volts to clamp tendencies for signals to ring above the bus termination pull-up voltage (VDD).

It should be noted that prior art clamping methods have only been a single clamp stage or action. There has been no internal pull-up inside the integrated circuit driver to help reduce ring down of the high pulse due to integrated circuit (IC) package parasitics. Ring down may be due to inductance and capacitance, as well as from external transmission line and loading bus interface characteristics.

A preferred embodiment of the invention includes an improved driver circuit for GTL-type bus systems, and provides higher bus signal integrity and quality for VLSI devices connected to the bus in that it prevents large overshoots and ringing of the signal output by the driver. A preferred embodiment is capable of compensating for IC package parasitics and bus impedance loading factors while driving relatively high currents typically of 48 ma or greater with relatively little internal dissipation. The active pull-up circuit embodiment is also applicable to inclusion in bus receivers for further enhanced signal quality. The drive/receive clamp circuit can be used in any GTL-type of driver or receiver or I/O cell by itself or in combination with sequential clamping and active pull-up.

Figure 1B:
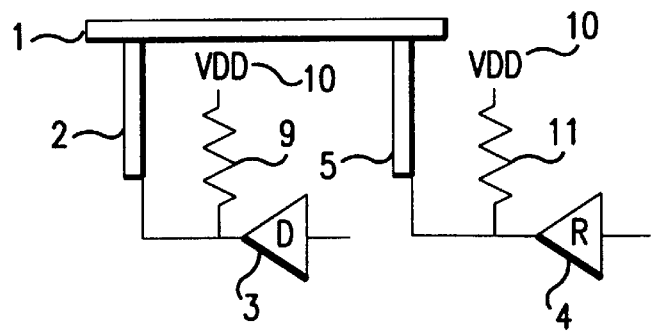
FIG. 1B is a diagram of a GTL-type bus being driven by a preferred embodiment of a driver.
Figure 1C:
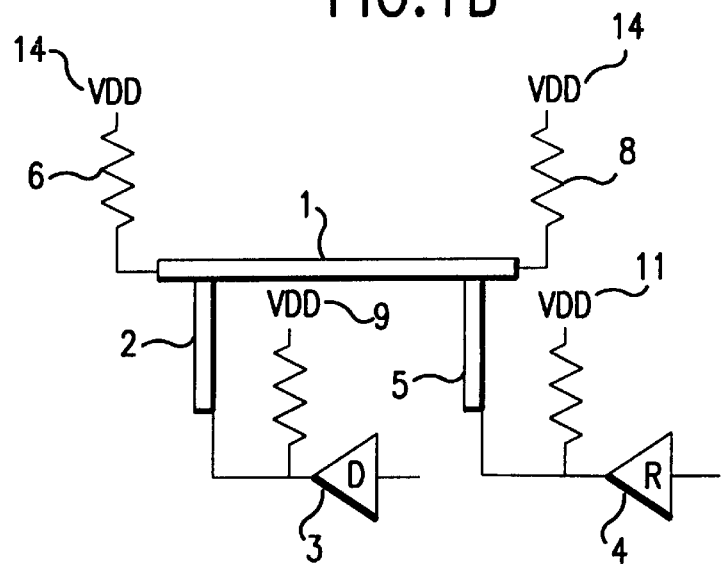
FIG. 1C is a diagram of a GTL-type bus.

FIGS. 1A–1C show variations on a prior art GTL bus 1 is shown as a transmission line to which a number of VLSI devices such as drivers, receivers, or combination driver/receivers, also known as transceivers, can be connected. For simplicity, FIG. 1 shows only two active parts, namely a driver 3 and a receiver 4, which are marked D and R respectively, and could be contained in VLSI integrated circuits and are most likely part of a transceiver circuit or bi-directional I/O (input/output) device inside the IC (integrated circuit.) Due to physical component placement constraints on the printed circuit board, there may be transmission lines 2 and 5 required to connect the driver 3 and the receiver 4 to the bus 1. Termination of the transmission lines 1, 2, and 5, can be accomplished by resistors 6 and 8 only as shown in FIG. 1A, or if a driver designed in accord with a preferred embodiment is used (described hereinbelow), by resistors 9 and 11 only as shown in FIG. 1B, or by the combination of resistors 6, 8, 9, 11 as shown in FIG. 1C. Improved signal quality is principally achieved by the use of terminations 9 and 11 in FIGS. 1B and 1C. Voltage sources provide the necessary voltage for "pull-up". The main purpose of the description hereinabove is to illustrate the flexibility of termination methods that may be used with the invention. Note that if a design were to adhere strictly to the GTL bus termination method, only the FIG. 1A termination method using resistors 6 and 8 and the voltage source 7 could be utilized.

In addition, it should be noted that by only using the GTL bus configuration and terminations 6 and 8, severe signal distortion and ringing may occur at the output of the driver 3 and the input to the receiver 4, and also at the junctions of the transmission lines 1, 2, and 5. For simplicity, the VLSI device power and ground connections are not shown. Such connections would normally provide VDD (usually 3.3 volts) and 0 volts or ground for operation of the VLSI devices including the transceivers (drivers and receivers.)

Figure 2:
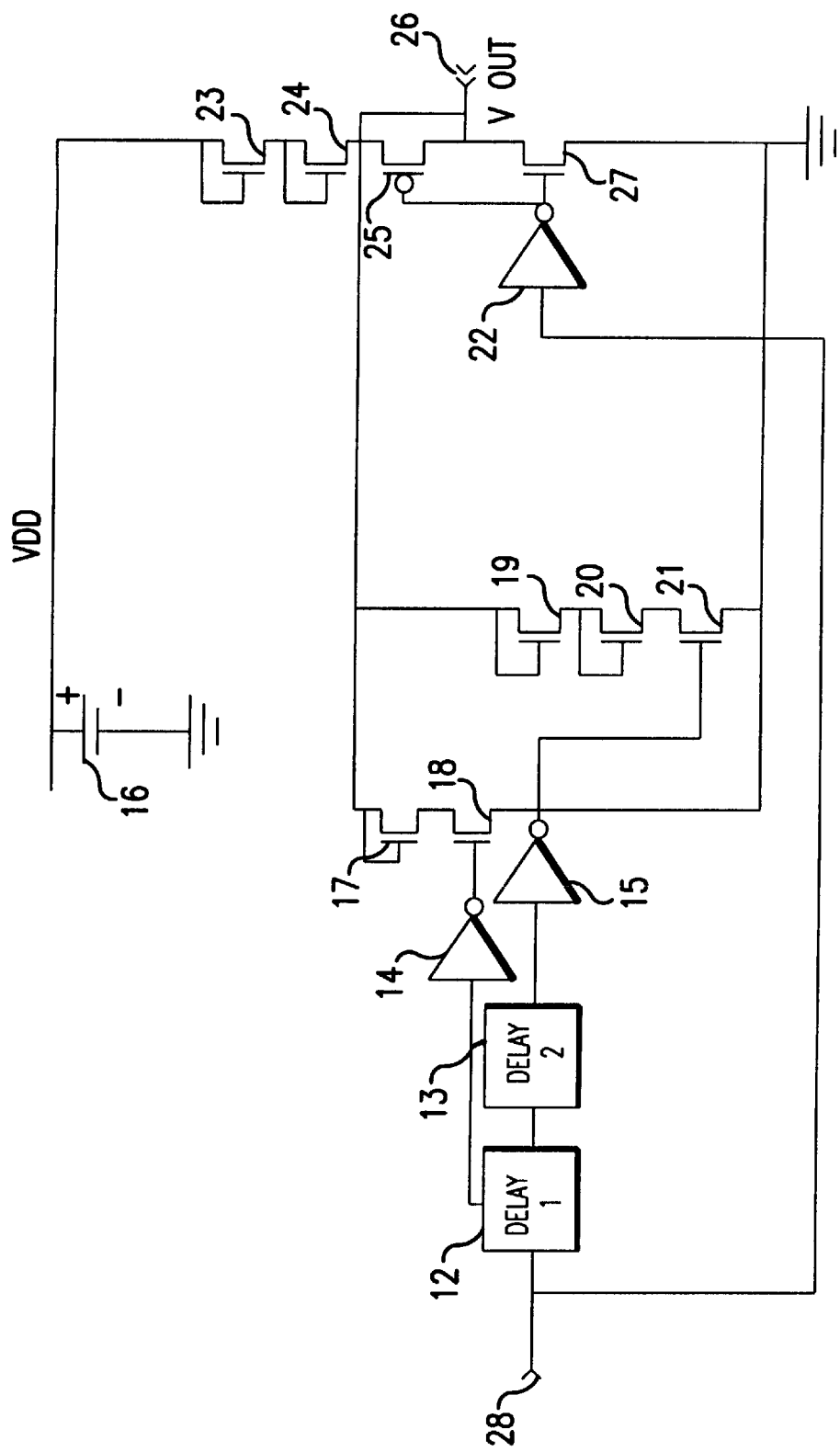
FIG. 2 is a diagram of a driver in accord with a preferred embodiment of the invention.

In FIG. 2, the operation of the improved driver circuit is accomplished first by the clamping devices, load FET transistors 17, 19, 20, and driver FET transistors 18, 21. Second, but equally important, the driver improvement is accomplished also by the active pull-up devices, load FET transistors 23, 24, and CMOS transistor 25. These sequentially clamping and pull-up devices control the voltage output 26 for overshoot and ring down when the output transistor 27 is going into, and is into, the non-conducting state as described hereinbelow.

The input signal 28 to the driver circuitry is split, going to delay circuit 12 (delay 1), and to inverter 22. The delay circuits 12, 13 may be designed in a number of different ways, the exact details of which are not fundamental to preferred embodiments of the invention, but are merely a means of delaying the input signal by approximately one nanosecond and approximately 3 nanoseconds, respectively. Proper functioning of the invention depends upon the delay elements 12, 13. Production of delay circuits capable of measuring such short time periods, irrespective of normal variations in supply voltage, junction temperatures, and silicon process variations, is possible with conventional fabrication techniques. A preferred embodiment, however, will utilize design techniques disclosed within U.S. Pat. No. 5,546,569 to Robert J. Proebsting; this patent discloses, among other things, clock pulse generation, and this patent is incorporated herein by reference. The invertors 14, 15, 22 are CMOS invertors. The sizes of the transistors and the inverter circuit are designed to provide the necessary drive speed and currents for their loads, transistors 18, 21, 27. The detailed design of the invertors are not critical to preferred embodiments of the invention, except to the extent that they must be capable of driving the aforementioned loads in terms of drive rise and fall times and drive currents, and provide the normal inverter driver function.

The delayed signal from delay circuit 12 (delay 1) is fed to the second delay circuit 13 (delay 2) which is similar to circuit 12 except that it has a longer delay of approximately 3 nanoseconds. This longer delayed signal is fed through inverter 15 to the second clamp circuit consisting of transistors 19, 20, 21. Meanwhile, the non-delayed signal is fed through the inverter 22 to operate the main output transistor 27, and the active pull-up circuit consisting of transistors 23, 24, 25. The logic polarity of the entire driver circuit can be inverting or non-inverting. FIG. 2 shows a non-inverting operation.

The operation of the circuit is as follows. Assume that the input signal 28 is high going at time t equal to $t_0$, in which transistors 18, 21 are initially ON. Let $t_1$ and $t_2$ respectively be the delay of the two delay circuits 12, 13. The inverted signal appears quickly at the gate of transistor 27 and turns it OFF. The active pull-up circuit consisting of transistors 23–25 is now ON because the gate of the PMOS transistor 25 has gone low due to inverter 22. (They are complementary.) For $t<t_1$, the output voltage 26 cannot go above the clamping voltage level set by transistors 17 and 18 of approximately 1.1 to 1.2 volt. This clamping level is determined by the threshold voltage of the diode-connected transistor 17 and the ON voltage across transistor 18. It should be noted here that the clamping circuit could be more complex than that shown in FIG. 2 to make it less susceptible to the effects of process variation. The exact circuit used to effect the clamp is not critical to the invention except to the extent described herein and that the clamping voltage remain relatively constant from device-to-device and from process run to the next process run. It is however important to the invention that the clamping times during the low through high cycle period of the signal be maintained regardless of the exact type of clamp topology used. The output voltage 26 also cannot drop below approximately 1 volt because the active pull-up 23–25 will then start to inject current because of the difference in voltage between the output 26 and the voltage at the source of transistor 24.

When $t \approx t_1$, which in a preferred embodiment is after a period of approximately 1 nanosecond, the delayed signal from the first delay circuit 12 changes the level of the output of inverter 14 from high to low thereby turning OFF the first clamp circuit, transistors 17, 18. This allows the output voltage 26 to come up to the second clamp level determined by the second clamp circuit 19–21 which is still in effect because $t<t_1+t_2$.

For $t \approx t_1+t_2$, the delay circuit 13 changes its output level from low to high and the inverter 15 turns OFF the second clamp circuit, transistors 19–21. At this time the output 26, is free to seek its natural pulled-up level due to the external pull-up circuit and external loads. However, due to the IC package parasitics and external circuit impedance and loading characteristics, the natural tendency of the output 26 would be to ring back downward, causing the active pull-up circuit 23–25 (still in effect) to inject current into the output 26 to resist the downward tendency.

When the high output time is finished and the input 28 goes low, the above process is performed in reverse, but without interfering with the low ON state of transistor 27 since it is immediately set low by inverter 22 acting from the new level at the input 28. During the output low time, the active pull-up is turned OFF. The clamp circuits are sequentially turned back ON to be ready for the next high level output. Note that when the output is going low, the first clamp circuit of transistors 17, 18 will turn ON, and then the second clamp circuit of transistors 19–21 turn on as the delay circuits 12 and 13 (delay 1 and delay 2) are timed out. Note that in order to prevent reflections and ringing from going low, an effect depending on the electrical length of the transmission line, output is now clamped so as not to exceed approximately 1.1 volts.

Figure 3:
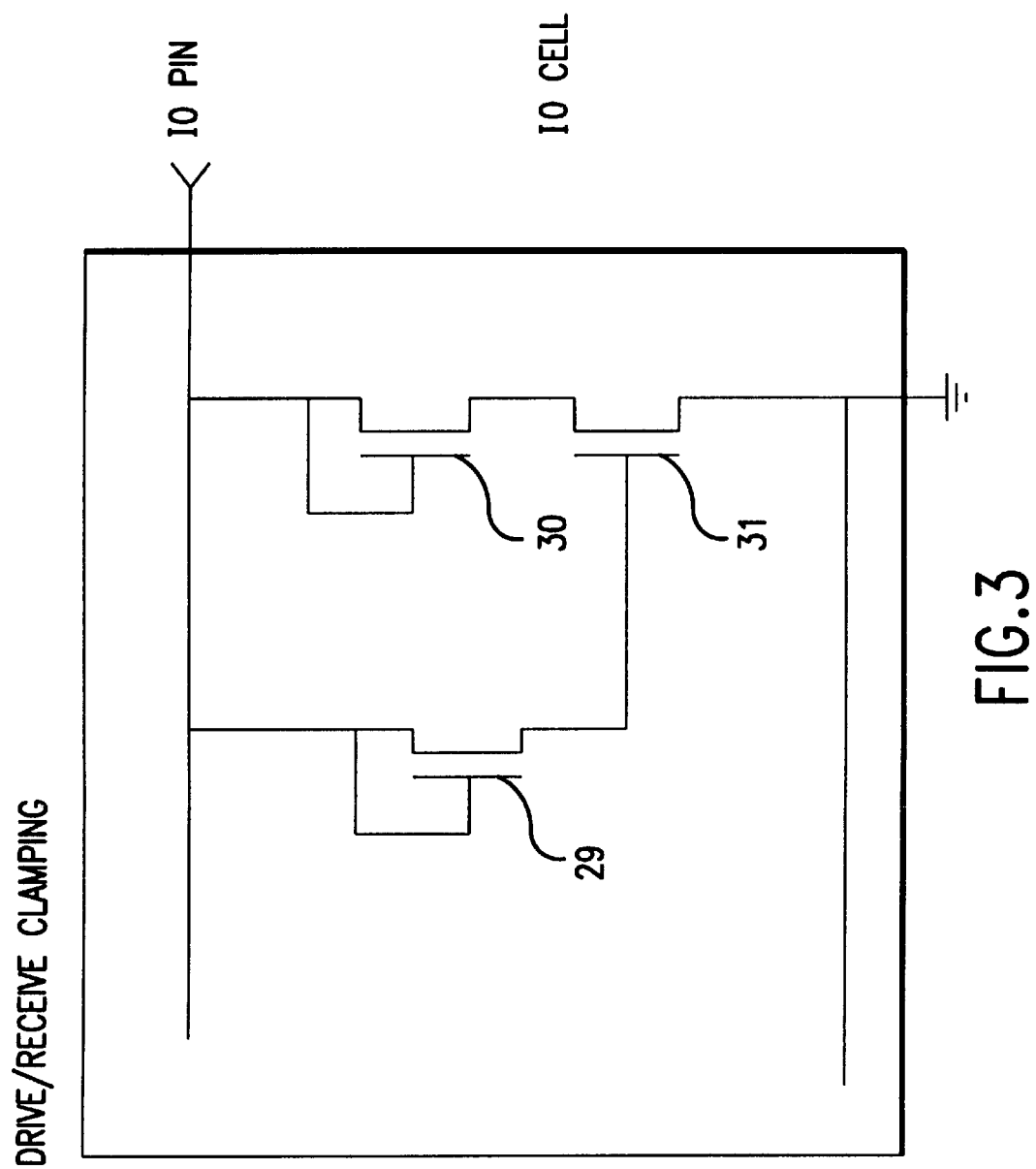
FIG. 3 is a diagram of a drive/receive clamp in accordance with a preferred embodiment of the invention.

In FIG. 3, the drive/receive clamp is described. A diode-connected n-channel MOSFET transistor 29 is connected to the output (I/O) pin of the device to sense voltages above approximately 1.5 volts. Transistor 29 charges the gate of n-channel MOSFET transistor 31 until it reaches turn-on threshold. If the total voltage of the I/O pin is high enough transistor 31 will start conducting as its threshold has been exceeded and current will conduct through n-channel MOSFET transistors 30 (a diode-connected load FET) and 31 (a load FET) thereby clamping the I/O pin voltage from ringing up to a high voltage (and thus distorting the signal). The amount of clamping required for a given application can be set by the size of the transistors, that is, the larger the transistors 30 and 31, the more clamp current that can be sunk for a given I/O pin voltage. Transistor 29 only needs to be large enough to supply the needed gate charging current for transistor 31 in time to cause the circuit to effectively clamp the high-frequency signal.

What is claimed is:

1. A driver for providing bus signals at a driver output in response to an input signal, the driver having a driver input responsive to the input signal, a supply voltage terminal, and a ground terminal, the driver comprising:

(a) a first switching element having a switching state responsive to the input signal to provide a low impedance between the driver output and the ground terminal when the first switching element is ON and to provide a high impedance between the driver output and the ground terminal when the first switching element is OFF;

(b) a second switching element having a switching state responsive to the input signal to provide a high impedance between the driver output and the supply voltage terminal when the second switching element is OFF, wherein the first and second switching elements are switched in a complementary fashion so that when the first switching element is switched from ON to OFF the second switching element is switched from OFF to ON and when the first switching element is switched from OFF to ON the second switching element is switched from ON to OFF;

(c) a first clamping device to provide a non-linear resistance diode-action between the driver output and the ground terminal when the second switching element is ON;

(d) a first delay element having an input responsive to the input signal, and an output with a voltage;

(e) a third switching element having a switching state responsive to the output voltage of the first delay element, so as to provide a high impedance between the driver output and the ground terminal when the third switching element is OFF;

(f) a second clamping device to provide a non-linear resistance diode-action between the driver output and the ground terminal when the third switching element is ON;

(g) a second delay element having an input responsive to the output voltage of the first delay element, and an output with a voltage;

(h) a fourth switching element having a switching state responsive to the output voltage of the second delay element to provide a high impedance between the driver output and the ground terminal when the fourth switching element is OFF; and (i) a third clamping device to provide a non-linear resistance diode-action between the driver output and the ground terminal when the fourth switching element is ON.

2. A driver according to claim 1, wherein:

(a) the first clamping device includes first and second diode-connected MOSFETs connected in series;

(b) the second clamping device includes a third diode-connected MOSFET; and (c) the third clamping device includes a fourth diode-connected MOSFET.

3. A driver according to claim 2, wherein:

(a) the first and second switching elements together include a CMOS switch;

(b) the third switching element includes a first MOSFET switch; and (c) the fourth switching element includes a second MOSFET switch.

4. A driver according to claim 3, the driver further comprising a drive-receive clamp, the drive-receive clamp comprising:

(a) a third MOSFET to provide a high impedance between the driver output and the ground terminal when the MOSFET is OFF;

(b) a fifth diode-connected MOSFET to provide a non-linear resistance diode-action between the driver output and the ground terminal when the third MOSFET is ON; and (c) a sixth diode-connected MOSFET to switch the third MOSFET ON and OFF, the sixth diode-connected MOSFET responsive to the driver output voltage so that the third MOSFET is switched ON when the driver output's voltage exceeds a high voltage level.

5. A driver according to claim 1, the driver further comprising a drive-receive clamp, the drive-receive clamp comprising:

(a) a fifth switching element to provide a high impedance between the driver output and the ground terminal when the fifth switching element is OFF;

(b) a fourth clamping device to provide a non-linear resistance diode-action between the driver output and the ground terminal when the fifth switching element is ON; and (c) a sixth switching element to switch the fifth switching element ON and OFF, the fifth clamping element responsive to the driver output voltage so that the fifth switching element is switched ON when the driver output's voltage exceeds a high voltage level.

6. The driver as set forth in claim 1, wherein:

(a) the first clamping device clamps the driver output's voltage so as not to fall below a first voltage when the second switching element is ON;

(b) the second clamping device clamps the driver output's voltage so as not to rise above a second voltage when the third switching element in ON; and (c) the third clamping device clamps the driver output's voltage so as not to rise above a third voltage when the fourth switching element is ON, wherein the first voltage is less than the second and third voltages, and the third voltage is greater than the second voltage.

7. The driver as set forth in claim 6, further comprising a drive-receive clamp, the drive-receive clamp including:

(a) a fifth switching element to provide a high impedance between the driver output and the ground terminal when the fifth switching element is OFF;

(b) a fourth clamping device to clamp the driver output's voltage so as not to rise above a first high voltage when the fifth switching element is ON; and (c) a sixth switching element to switch the fifth switching element ON when driver output's voltage rises above a second high voltage.

8. A method of driving a GTL-type bus with a driver of claim 1, the method comprising placing a resistive termination means at the driver node in combination with the standard GTL-type bus termination.

9. A method according to claim 8, the method further comprising the step of placing a resistive termination means at the receiver node in combination with the standard GTL-type bus termination.

10. A communications system, comprising:

(a) a communication bus;

(b) a driver for providing bus signals on the communication bus in response to an input signal, the driver having:

i. a first and a second complementary switch responsive to the input signal,
   (1) the first complementary switch having low impedance between the driver output and the ground terminal when ON, and having high impedance when OFF, and
   (2) the second complementary switch having a high impedance between the driver output and the supply voltage terminal when the switch is OFF, so that when the first switch is switched from ON to OFF the second switch is switched from OFF to ON and when the first switch is switched from OFF to ON the second switch is switched from ON to OFF;
ii. a first clamping device to provide a non-linear resistance diode-action between the driver output and the supply voltage terminal when the second switch is ON;
iii. a first delay element having an input responsive to the input signal, and an output with a voltage;
iv. a third switch responsive to the output voltage of the first delay element, to provide a high impedance between the driver output and the ground terminal when OFF;
v. a second clamping device to provide a non-linear resistance diode-action between the driver output and the ground terminal when the third switching element is ON;
vi. a second delay element having an input responsive to the output voltage of the first delay element, and an output with a voltage;
vii. a fourth switch responsive to the output voltage of the second delay element, to provide a high impedance between the driver output and the ground terminal when OFF; and
viii. a third clamping device to provide a non-linear resistance diode-action between the driver output and the ground terminal when the fourth switching element is ON.

11. A communications system according to claim 10, the bus further comprising a drive-receive clamp, the drive-receive clamp comprising:
   (a) a fifth switch having high impedance between the driver output and the ground terminal when OFF;
   (b) a fourth clamping device to provide a non-linear resistance diode-action between the driver output and the ground terminal when the fifth switching element is ON; and
   (c) a fifth clamping device to switch the fifth switch ON and OFF, the fifth clamping element responsive to the driver output voltage so that the fifth switch is switched ON when the driver output's voltage exceeds a high voltage level.

12. A communications system according to claim 10, wherein:
   (a) the first clamping device includes first and second diode-connected MOSFETs connected in series;
   (b) the second clamping device includes a third diode-connected MOSFET; and
   (c) the third clamping device includes a fourth diode-connected MOSFET.

13. A communications system according to claim 12, wherein the first and second switches together include a CMOS switch, the third switch includes a first MOSFET switch, and the fourth switch includes a second MOSFET switch.

14. A communications system according to claim 10, wherein the communication bus is a GTL-type communication bus.

15. A communications system according to claim 14, wherein:
   (a) the first clamping device includes first and second diode-connected MOSFETs connected in series;
   (b) the second clamping device includes a third diode-connected MOSFET; and
   (c) the third clamping device includes a fourth diode-connected MOSFET.

16. A communications system according to claim 15, wherein the first and second switches together include a CMOS switch, the third switch includes a first MOSFET switch, and the fourth switch includes a second MOSFET switch.

17. A method of driving the communications bus of claims 10, the method comprising placing a resistive termination means at the driver node in combination with the standard GTL-type bus termination.

18. A method according to claim 17, the method further comprising the step of placing a resistive termination means at the receiver node in combination with the standard GTL-type bus termination.

19. A method for switching a driver output voltage to provide bus signals on a bus, the method comprising the steps of:
   (a) switching OFF an active pull down circuit and switching ON an active pull up circuit, wherein the active pull up circuit clamps the driver output voltage from falling below a first voltage;
   (b) switching OFF a first clamping circuit, wherein the first clamping circuit clamps the driver output voltage from exceeding a second voltage when the first clamping circuit is ON, wherein the second voltage is greater than the first voltage; and
   (c) switching OFF a second clamping circuit;
wherein the second clamping circuit clamps the driver output voltage from exceeding a third voltage when the second clamping circuit is ON, wherein the third voltage is greater than the second voltage.

20. The method as set forth in claim 19, further comprising the steps of:
   (d) switching ON the active pull down circuit and switching OFF the active pull up circuit;
   (e) switching ON the first clamping circuit; and
   (f) switching ON the second clamping circuit.

21. The method as set forth in claim 20, wherein:
   (a) the pull down circuit includes a first MOSFET;
   (b) the pull up circuit includes
      i. a second MOSFET,
      ii. a first diode-connected MOSFET, and
      iii. a second diode-connected MOSFET,
      wherein the first and second MOSFETs are configured as a CMOS switching element, the CMOS switching element and the first and second diode-connected MOSFETs are connected in series, and the second diode-connected MOSFET is connected to a voltage supply source;
   (c) the first clamping device includes a third MOSFET, and a third diode-connected MOSFET, wherein the third MOSFET is connected in series to the third diode-connected MOSFET; and
   (d) the second clamping device includes
      i. a fourth MOSFET, ii. a fourth diode-connected MOSFET, and iii. a fifth diode-connected MOSFET, wherein the fourth MOSFET and fourth and fifth diode-connected MOSFETs are connected in series.

22. A device for switching a driver output voltage to provide bus signals on a bus, comprising:

(a) means for switching OFF an active pull down circuit and switching ON an active pull up circuit, wherein the active pull up circuit clamps the driver output voltage from falling below a first voltage;

(b) means for switching OFF a first clamping circuit, wherein the first clamping circuit clamps the driver output voltage from exceeding a second voltage when the first clamping circuit is ON, wherein the second voltage is greater than the first voltage; and (c) means for switching OFF a second clamping circuit; wherein the second clamping circuit clamps the driver output voltage from exceeding a third voltage when the second clamping circuit is ON, wherein the third voltage is greater than the second voltage.

23. A driver for providing bus signals at a driver output in response to an input signal, the driver having a driver input responsive to the input signal, a supply voltage terminal, and a ground terminal, the driver comprising:

(a) a first switch responsive to the input signal, having low impedance between the driver output and the ground terminal when the first switch is ON, and high impedance when the first switch is OFF;

(b) a second switch responsive to the input signal, having high impedance between the driver output and the supply voltage terminal when the second switch is OFF;

(c) a first load between the driver output and the ground terminal;

(d) a first delay element having an input responsive to the input signal, and an output with a voltage;

(e) a third switch responsive to the output voltage of the first delay element, having high impedance between the driver output and the ground terminal when the third switching element is OFF; and (f) a second load between the driver output and the ground terminal when the third switching element is ON;

wherein the first and second switches are switched in a complementary fashion so that when the first switch is switched from ON to OFF the second switch is switched from OFF to ON.

24. A driver according to claim 23, the driver further comprising:

(a) a second delay element having an input responsive to the output voltage of the first delay element, and an output with a voltage;

(b) a fourth switch responsive to the output voltage of the second delay element, having high impedance between the driver output and the ground terminal when the fourth switching element is OFF; and (c) a third load between the driver output and the ground terminal when the fourth switching element is ON.

25. A driver according to claim 24, wherein the first load includes means for providing a non-linear resistance diode-action between the driver output and the ground terminal when the second switching element is ON;

wherein the second load includes means for providing a non-linear resistance diode-action between the driver output and the ground terminal when the third switching element is ON; and wherein the third load includes means for providing a non-linear resistance diode-action between the driver output and the ground terminal when the fourth switching element is ON.

26. A driver according to claim 23, wherein the first load includes means for providing a non-linear resistance diode-action between the driver output and the ground terminal when the second switching element is ON.

27. A driver according to claim 26, wherein the second load includes means for providing a non-linear resistance diode-action between the driver output and the ground terminal when the third switching element is ON.

* * * * *